US012672356B2

(12) United States Patent
Noguchi et al.

(10) Patent No.: US 12,672,356 B2
(45) Date of Patent: Jun. 30, 2026

(54) ACCELERATION SENSOR

(71) Applicant: ROHM CO., LTD., Kyoto (JP)

(72) Inventors: Youichiro Noguchi, Kyoto (JP);
Satoshi Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 386 days.

(21) Appl. No.: 18/218,207

(22) Filed: Jul. 5, 2023

(65) Prior Publication Data

US 2024/0162219 A1 May 16, 2024

(30) Foreign Application Priority Data

Jul. 7, 2022 (JP) .................................. 2022-109575

(51) Int. Cl.
  *H10D 89/60* (2025.01)
  *G01P 15/08* (2006.01)
  *G01P 15/125* (2006.01)
  *G01P 15/18* (2013.01)

(52) U.S. Cl.
  CPC ........ H10D 89/611 (2025.01); G01P 15/0802 (2013.01); G01P 15/125 (2013.01); G01P 15/18 (2013.01); H10D 89/813 (2025.01); G01P 2015/0865 (2013.01)

(58) Field of Classification Search
  CPC .... G01P 15/125; G01P 15/0802; G01P 15/18; G01P 2015/0814
  See application file for complete search history.

(56) References Cited

U.S. PATENT DOCUMENTS

| | | | | |
|---|---|---|---|---|
| 5,343,064 A * | 8/1994 | Spangler | ............... | G01P 15/125 |
| | | | | 257/350 |
| 5,643,803 A * | 7/1997 | Fukada | ................. | G01P 15/124 |
| | | | | 257/E21.216 |
| 6,250,165 B1 * | 6/2001 | Sakai | .................. | G01P 15/0802 |
| | | | | 73/754 |
| 6,617,191 B1 * | 9/2003 | Iwata | .................. | H01L 21/3063 |
| | | | | 257/E21.216 |
| 2005/0134384 A1 * | 6/2005 | Sato | ........................ | H03F 3/185 |
| | | | | 330/277 |

(Continued)

FOREIGN PATENT DOCUMENTS

JP 2019049434 3/2019

*Primary Examiner* — Helen C Kwok
(74) *Attorney, Agent, or Firm* — Fish & Richardson P.C.

(57) ABSTRACT

The present disclosure provides an acceleration sensor including a sensor device and a signal processing device sealed in a single package. The sensor device is configured to generate an acceleration signal, and the signal processing device is configured to process the acceleration signal. The signal processing device includes a signal input terminal, a first electrostatic protection element and a second electrostatic protection element. The signal input terminal is configured to receive an external input of the acceleration signal. The first electrostatic protection element is configured to be connected between the signal input terminal and a first node to which a first voltage is applied. The second electrostatic protection element is configured to be connected between the signal input terminal and a second node to which a second voltage is applied. The first electrostatic protection element and the second electrostatic protection element have the same structure and leakage current characteristic.

18 Claims, 8 Drawing Sheets

(56)  References Cited

U.S. PATENT DOCUMENTS

| 2006/0169042 | A1* | 8/2006 | Hulsing | ............. | G01C 19/5719 |
| | | | | | 73/510 |
| 2014/0043032 | A1* | 2/2014 | Makino | ................ | G01R 31/007 |
| | | | | | 327/109 |

* cited by examiner

ACCELERATION SENSOR

TECHNICAL FIELD

The present disclosure relates to an acceleration sensor.

BACKGROUND

An acceleration sensor serves as a mechanism that keeps aware of an orientational, motional or vibrational state of an object, and is used in various applications typically represented by in-vehicle machines and industrial machines.

Moreover, patent publication 1 may be referred to as an example in the related prior art.

PRIOR ART DOCUMENT

Patent Publication

[Patent publication 1] Japan Patent Publication No. 2019-049434

DETAILED DESCRIPTION OF THE EMBODIMENTS

<Acceleration Sensor>

Figure 1:
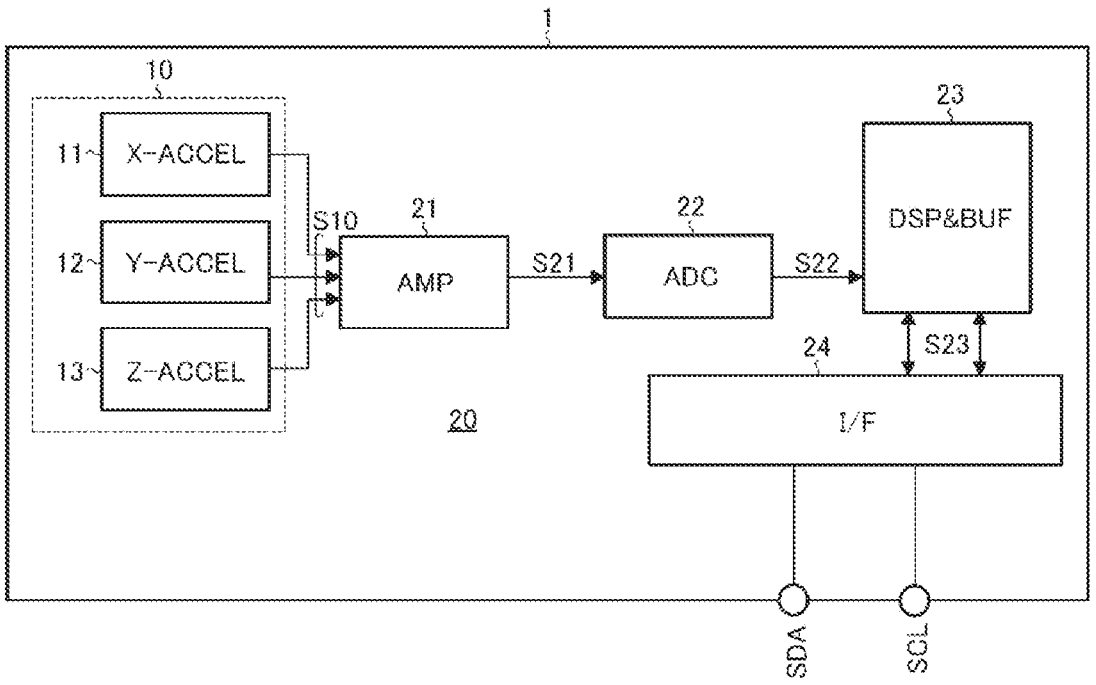
FIG. 1 is a diagram of an overall configuration of an acceleration sensor.

FIG. 1 shows a diagram of an overall configuration of an acceleration sensor. An acceleration sensor 1 of this configuration example is a module used to detect the orientation, motion or vibration state of an application (such as an in-vehicle machine and an industrial machine) to which it is mounted, and is formed by means of sealing a sensor device 10 and a signal processing device 20 in a single package.

The sensor device 10 includes an X-axis sensor unit 11, a Y-axis sensor unit 12 and a Z-axis sensor unit 13, and generates a tri-axial acceleration signal S10. The acceleration signal S10 is, for example, an analog voltage signal. Moreover, in the aim of miniaturization of the sensor device 10, an electrostatic capacitance means of the micro-electro-mechanical system (MEMS) technology may be used as an acceleration detection means (with details described below).

The signal processing device 20 is a semiconductor integrated circuit device (Application Specific Integrated Circuit, ASIC) that processes the acceleration signal S10 by using various algorithms. According to the depiction of this drawing, the signal processing device 20 includes an input amplifier 21, an analog-to-digital converter (ADC) 22, a processor 23 and an interface 24.

The input amplifier 21 amplifies the acceleration signal S10 to generate an amplified acceleration signal S21.

The ADC 22 converts the amplified acceleration signal S21 to a digital signal S22.

The processor 23 generates a sensor output signal S23 from the digital signal S22. A digital signal processor (DSP) and a buffer may also be used as the processor 23.

The interface 24 externally outputs the sensor output signal S23 according to a specified protocol (for example, inter-integrated circuit (I2C) and serial peripheral interface (SPI)). Moreover, the interface 24 receives and transmits external inputs of various control signals to the processor 23. According to the depiction of this drawing, the interface 24 includes, for example, an SDA port and an SCL port as input/output ports of the 12C protocol.

<Sensor Device>

Figure 2:
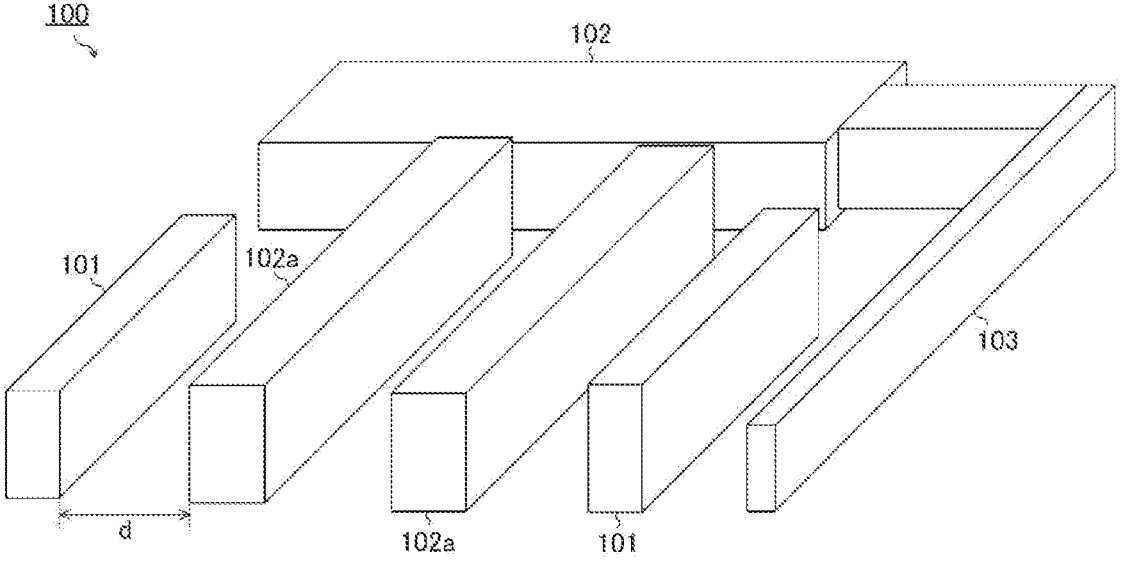
FIG. 2 is a diagram of a configuration example of a sensor device.

FIG. 2 shows a diagram of a configuration example of the sensor device 10 (particularly as an MEMS element used for the X-axis sensor unit 11, the Y-axis sensor unit 12 and the Z-axis sensor unit 13). An MEMS element 100 of this configuration example includes a fixed electrode 101, a variable electrode 102, and an elastic support component 103.

The fixed electrode 101 is configured such that the position thereof does not change according to the acceleration applied to the sensor device 10. Moreover, as shown in this drawing, the fixed electrode 101 may also be plural in quantity.

The variable electrode 102 includes a protrusion 102a extending opposite to the fixed electrode 101, and is elastically supported such that the position of the protrusion 102a relative to the fixed electrode 101 (hence an inter-electrode distance d) changes according to the acceleration applied to the sensor device 10.

The elastic support component 103 (for example, a leaf spring) elastically supports the variable electrode 102.

If an acceleration is applied to the MEMS element 100, the variable electrode 102 moves in the left and right directions of the paper, and so the inter-electrode distance d between the fixed electrode 101 and the variable electrode 102 (=the protrusion 102a) changes. As a result, the size of electrostatic capacitance between the fixed electrode 101 and the variable electrode 102 changes. Thus, by outputting the voltage generated between the fixed electrode 101 and the variable electrode 102 as the acceleration signal S10, the acceleration can be linearly measured.

<Signal Processing Device>

Figure 3:
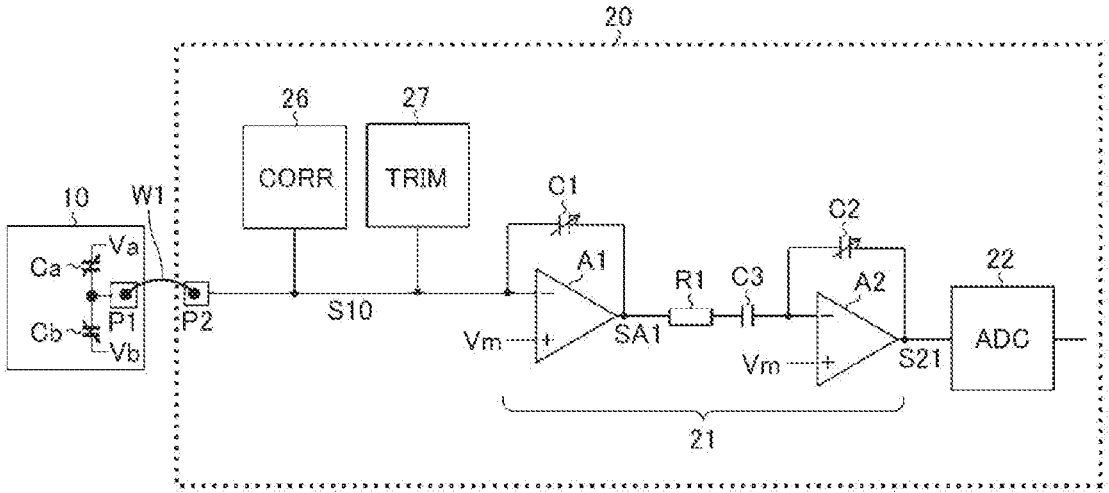
FIG. 3 is a diagram of a configuration example of a signal processing device.

FIG. 3 shows a diagram of a configuration example of the signal processing device 20 (particularly including front-end periphery of the sensor device 10).

The sensor device 10 is described as an MEMS capacitance model including capacitors Ca and Cb. According to the depiction of this drawing, a first terminal of the capacitor Ca is connected to an application terminal of a first driving voltage Va. A second terminal of the capacitor Ca and a first terminal of the capacitor Cb are both connected to a pad P1. A second terminal of the capacitor Cb is connected to an application terminal of a second driving voltage Vb. Moreover, respective capacitance values of the capacitors Ca and Cb change according to the acceleration applied to the sensor device 10.

In addition to the input amplifier 21 and the ADC 22 described above, the signal processing device 20 further includes a pad P2, an offset correction unit 26 and an offset adjustment unit 27.

The pad P2 is equivalent to a signal input terminal that receives an external input of the acceleration signal S10. Moreover, a wire W1 is bonded between the pad P1 disposed at the sensor device 10 and the pad P2 disposed at the signal processing device 20.

As described above, the input amplifier 21 amplifies the acceleration signal S10 to generate the amplified acceleration signal S21. According to the depiction of this drawing, the input amplifier 21 includes amplifiers A1 and A2, capacitors C1 to C3 and a resistor R1.

An inverting input terminal (–) of the amplifier A1 and a first terminal of the capacitor C1 are both connected to the pad P2. An output terminal (=an application terminal to which an amplifier output signal SA1 is applied) of the amplifier A1 and a second terminal of the capacitor C1 are both connected to a first terminal of the resistor R1. A second terminal of the resistor R1 is connected to a first terminal of the capacitor C3. An inverting input terminal (–) of the amplifier A2 and a first terminal of the capacitor C2 are both connected to a second terminal of the capacitor C3. An output terminal of the amplifier A2 and a second terminal of the capacitor C2 are both connected to an application terminal of the amplified acceleration signal S21. Respective non-inverting input terminals (+) of the amplifiers A1 and A2 are both connected to an application terminal of a bias voltage Vm.

Moreover, a user can set a numeral range of acceleration as desired by means of adjusting the capacitance value of the capacitor C1, and can trim the gain of the input amplifier 21 by means of adjusting the capacitance value of the capacitor C2.

The offset correction unit 26 performs correction by means of reducing a temperature gradient of an input offset of the acceleration signal S10.

The offset adjustment unit 27 performs adjustment by means of trimming the input offset of the acceleration signal S10.

<Input Amplifier>

Figure 4:
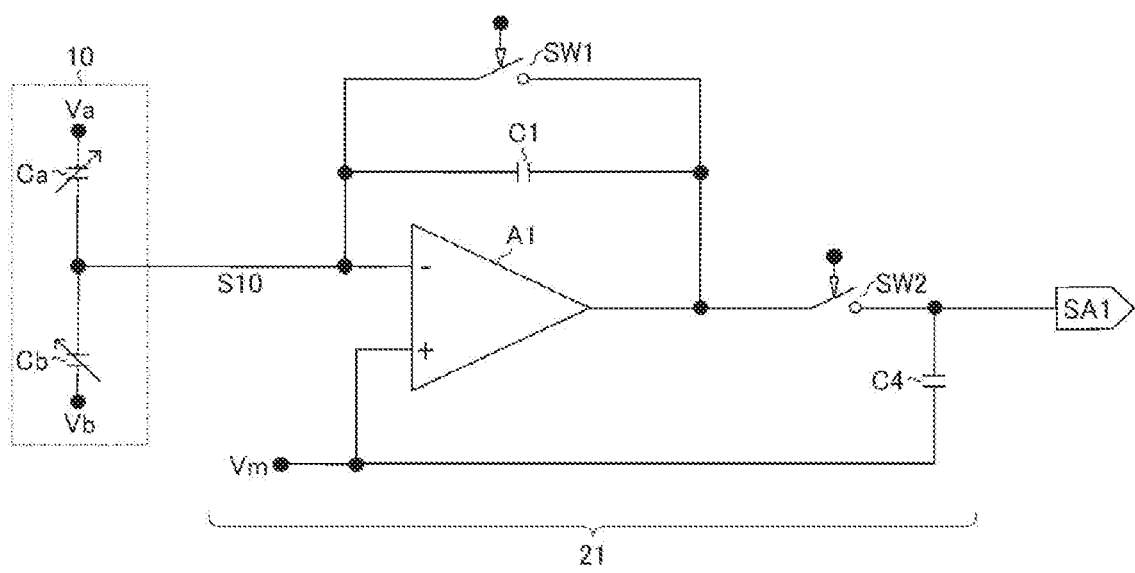
FIG. 4 is a diagram of a configuration example of an input amplifier.

FIG. 4 shows a diagram of a configuration example of the input amplifier 21. In addition to the amplifier A1 and the capacitor C1 described above, the input amplifier 21 of this configuration example further includes a capacitor C4 and switches SW1 and SW2.

A first terminal of the switch SW1 is connected to the inverting input terminal (–) of the amplifier A1. A second terminal of the switch SW1 and a first terminal of the switch SW2 are both connected to the output terminal of the amplifier A1. A second terminal of the switch SW2 and a first terminal of the capacitor C4 are both connected to an application terminal of the amplifier output signal SA1. A second terminal of the capacitor C4 is connected to the application terminal of the bias voltage Vm.

Figure 5:
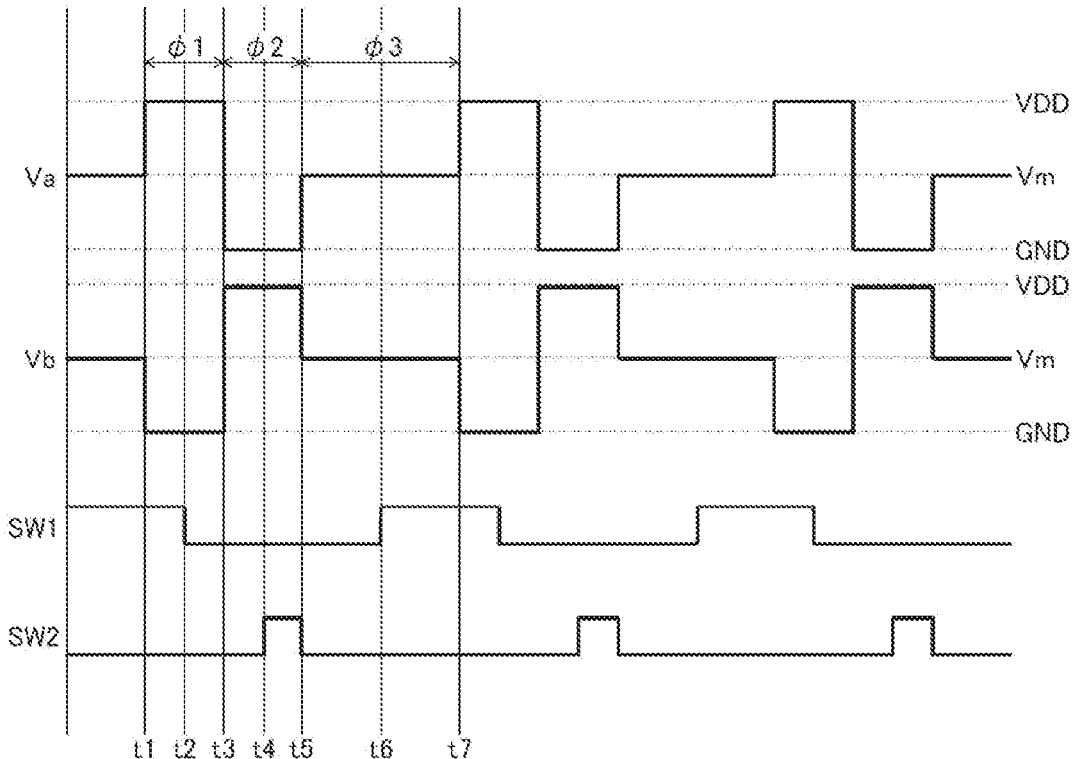
FIG. 5 is a diagram of an operation example of an input amplifier.

FIG. 5 shows a diagram of an operation example of the input amplifier 21 (particularly the amplifier A1), and depicts from top to bottom, the first driving voltage Va, the second driving voltage Vb, and respective operation statuses of the switches SW1 and SW2 (H=on, L=off).

In a first stage ϕ1 (=timings t1 to t3), the first driving voltage Va is set to a high level (for example, Va=VDD), and the second driving voltage Vb is set to a low level (for example, Vb=GND). That is to say, the inter-electrode voltage (Va-Vb) applied between the fixed electrode 101 and the variable electrode 102 of the MEMS element 100 used in the sensor device 10 is positive in polarity. At this point in time, a voltage signal obtained by means of capacitively dividing the inter-electrode voltage (Va-Vb) with the positive polarity by the capacitors Ca and Cb is output as an acceleration signal S10(ϕ1). Moreover, the switch SW1 switches from an on state to an off state in the middle (=timing t2) of the first stage ϕ1. On the other hand, the switch SW2 is persistently kept in an off state in the first stage ϕ1.

In a second stage ϕ2 (=timings t3 to t5), the first driving voltage Va is set to a low level (for example, Va=GND), and the second driving voltage Vb is set to a high level (for example, Vb=VDD). That is to say, the inter-electrode voltage (Va-Vb) applied between the fixed electrode 101 and the variable electrode 102 of the MEMS element 100 used in the sensor device 10 is negative in polarity. At this point in time, a voltage signal obtained by means of capacitively dividing the inter-electrode voltage (Va-Vb) with the negative polarity by the capacitors Ca and Cb is output as an acceleration signal S10(ϕ2). Moreover, the switch SW1 is persistently kept in an off state in the second stage ϕ2. On the other hand, the switch SW2 switches from an off state to an on state in the middle (=timing t4) of the second stage ϕ2.

In a third stage ϕ3 (=timings t5 to t7), the first driving voltage Va and the second driving voltage Vb are both set to a midpoint level (for example, Va=Vb=Vm=VDD/2). That is to say, the inter-electrode voltage (Va-Vb) applied between the fixed electrode 101 and the variable electrode 102 of the MEMS element 100 used in the sensor device 10 changes to 0 V, and hence an acceleration signal S10(ϕ3) also changes to 0 V. Moreover, the switch SW1 switches from an off state to an on state in the middle (=timing t6) of the third stage ϕ3. On the other hand, the switch SW2 is persistently kept in an off state in the third stage ϕ3.

With a series of operations above, in the input amplifier 21, the amplifier output signal SA1 (=VDD×(Ca−Cb)/C1) corresponding to a difference between the acceleration signal S10(ϕ1) obtained in the first stage ϕ1 and the acceleration signal S10(ϕ2) obtained in the second stage ϕ2 is generated. Thus, the amplifier output signal SA1 is not easily affected by relative deviation and noise superposition of capacitors Ca and Cb.

<Countermeasure Against Electrostatic Discharge (First Embodiment)>

Figure 6:
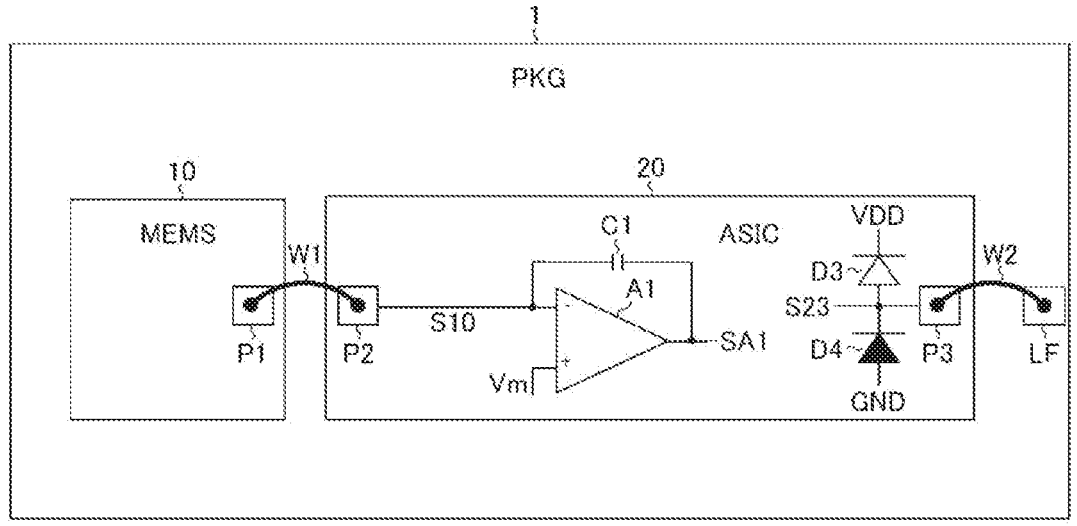
FIG. 6 is a diagram of a countermeasure against electrostatic discharge (first embodiment) of a signal processing device.

FIG. 6 shows a diagram of a countermeasure against electrostatic discharge (first embodiment) of the signal processing device 20. In addition to the constituting components described above, the signal processing device 20 of this embodiment further includes a pad P3 and electrostatic protection diodes D3 and D4.

The pad P3 is equivalent to a signal output terminal that externally outputs the sensor output signal S23. Moreover, a wire W2 is bonded between the pad P3 disposed at the signal processing device 20 and a lead frame LF drawn to the outside of the package of the acceleration sensor 1.

The anode of the electrostatic protection diode D3 (equivalent to a third electrostatic protection element) is connected to the pad P3. The cathode of the electrostatic protection diode D3 is connected to the application terminal (equivalent to a first node) of a power supply voltage VDD. When a positive surge (>VDD) is applied to the pad P3, the electrostatic protection diode D3 connected as above achieves the function of releasing the positive surge to the application terminal of the power supply voltage VDD. Moreover, a body diode of a P-channel type metal oxide semiconductor field effect transistor (PMOSFET) is generally used as the electrostatic protection diode D3.

The cathode of the electrostatic protection diode D4 (equivalent to a fourth electrostatic protection element) is connected to the pad P3. The anode of the electrostatic protection diode D4 is connected to the application terminal (equivalent to a second node) of the ground voltage GND. When a negative surge (<GND) is applied to the pad P3, the electrostatic protection diode D4 connected as above achieves the function of releasing the negative surge to the application terminal of the ground voltage GND. Moreover, a body diode of an N-channel type metal oxide semiconductor field effect transistor (NMOSFET) is generally used as the electrostatic protection diode D4.

Thus, in the signal processing device 20 of this embodiment, the electrostatic protection diodes D3 and D4 are disposed only at the pad P3 connected to the lead frame LF, and no electrostatic protection elements are disposed at the pad P2 connected to the pad P1 of the sensor device 10. Therefore, there is a concern for risks of electrostatic discharge during the assembly of the acceleration sensor 1.

<Countermeasure Against Electrostatic Discharge (Second Embodiment)>

Figure 7:
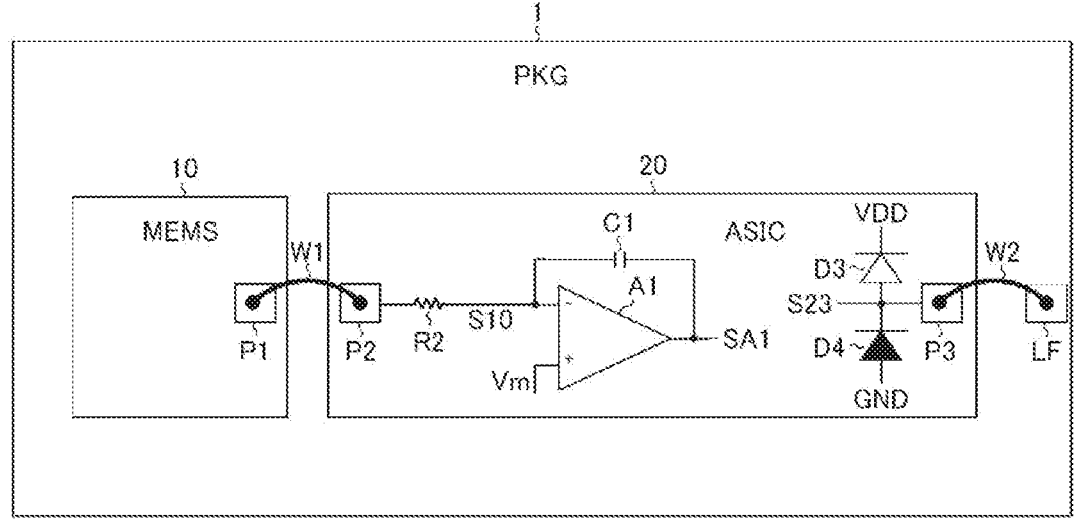
FIG. 7 is a diagram of a countermeasure against electrostatic discharge (second embodiment) of a signal processing device.

FIG. 7 shows a diagram of a countermeasure against electrostatic discharge (second embodiment) of a signal processing device. The signal processing device 20 of this embodiment is based on the first embodiment (FIG. 6) described above, and a current limiting resistor R2 is additionally provided between the pad P2 and the amplifier A1.

According to this embodiment, the resistance against electrostatic discharge of the pad P2 can be slightly increased in comparison with the first embodiment (FIG. 6) described above. However, the effect of reducing the risks of electrostatic discharge may not be thorough, and it cannot be denied that there is a concern for damage of the signal processing device 20 according to the size of the surge applied to the pad P2.

<Countermeasure Against Electrostatic Discharge (Third Embodiment)>

Figure 8:
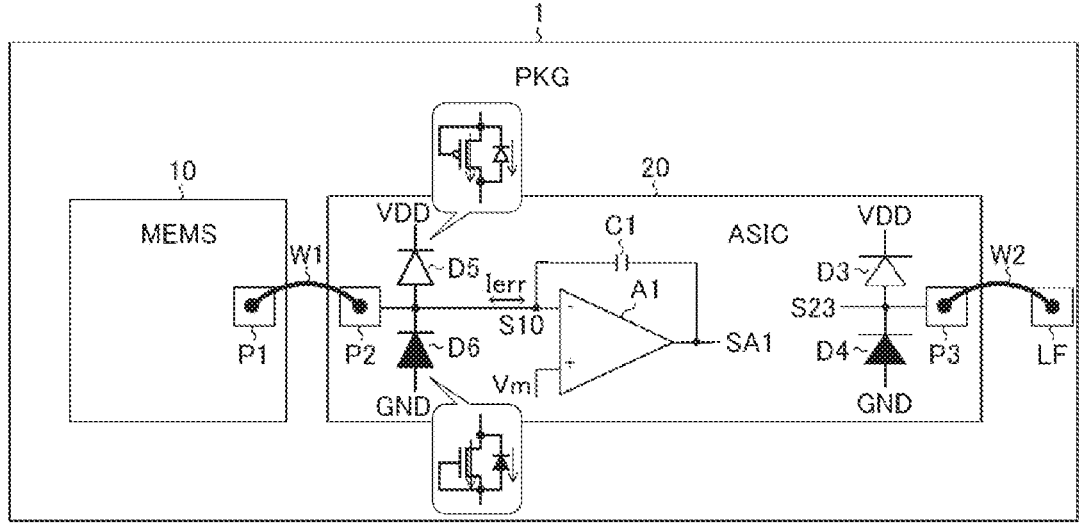
FIG. 8 is a diagram of a countermeasure against electrostatic discharge (third embodiment) of a signal processing device.

FIG. 8 shows a diagram of a countermeasure against electrostatic discharge (third embodiment) of a signal processing device. The signal processing device 20 of this embodiment is based on the first embodiment (FIG. 6) described above, and electrostatic protection diodes D5 and D6 are additionally provided.

The anode of the electrostatic protection diode D5 is connected to the pad P2. The cathode of the electrostatic protection diode D5 is connected to the application terminal of the power supply voltage VDD. When a positive surge (>VDD) is applied to the pad P2, the electrostatic protection diode D5 connected as above achieves the function of releasing the positive surge to the application terminal of the power supply voltage VDD. Moreover, the same as the electrostatic protection diode D3 described above, a body diode of a PMOSFET is generally used as the electrostatic protection diode D5.

The cathode of the electrostatic protection diode D6 is connected to the pad P2. The anode of the electrostatic protection diode D6 is connected to the application terminal of the ground voltage GND. When a negative surge (<GND) is applied to the pad P2, the electrostatic protection diode D6 connected as above achieves the function of releasing the negative surge to the application terminal of the ground voltage GND. Moreover, the same as the electrostatic protection diode D4 described above, a body diode of an NMOSFET is generally used as the electrostatic protection diode D6.

According to this embodiment, the resistance against electrostatic discharge of the pad P2 can by thoroughly increased in comparison with the first embodiment (FIG. 6) and the second embodiment (FIG. 7) described above.

However, due to significantly different structures of electrostatic protection diodes D5 and D6, the respective leakage current characteristics may be deviated. Thus, the difference of the leakage current flowing into each of the electrostatic protection diodes D5 and D6 may act as an error current Ierr that flows to the pad P2. When such error current Ierr flows, an undesired input offset is added to the acceleration signal S10, leading to deterioration of the detection precision of acceleration.

Moreover, in the electrostatic protection diodes D5 and D6 structured as MOS, two systems including a leakage current path passing through the MOSFET and a leakage current path passing through the body diode are present. Thus, the leakage current flowing into each of the electrostatic protection diodes D5 and D6 is larger. Hence, the error current Ierr likely gets larger, further easily increasing the input offset of the acceleration signal S10.

More particularly, the acceleration signal S10 generated in the sensor device 10 (more specifically, the MEMS element 100) is a minute analog voltage signal. Thus, in order to enhance the detection precision of acceleration, it is critical to minimize the error current Ierr.

Moreover, if the respective structures of the electrostatic protection diodes D5 and D6 are different, the parasitic capacitance accompanying each of the diodes is also different. This may account for the deterioration of the detection precision of acceleration <Countermeasure Against Electrostatic Discharge (Fourth Embodiment)>

Figure 9:
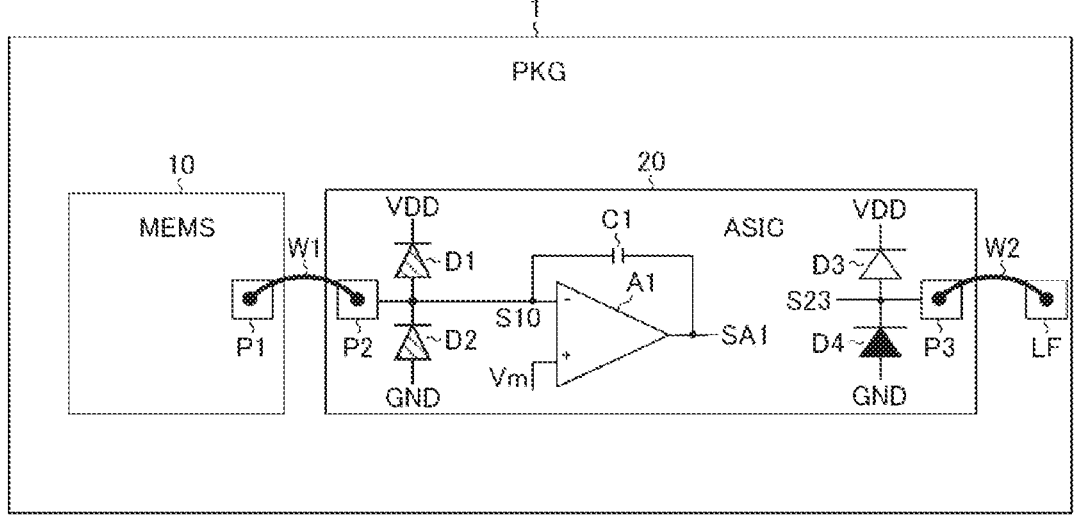
FIG. 9 is a diagram of a countermeasure against electrostatic discharge (fourth embodiment) of a signal processing device.

FIG. 9 shows a diagram of a countermeasure against electrostatic discharge (fourth embodiment) of a signal processing device. The signal processing device 20 of this embodiment is based on the third embodiment (FIG. 8) described above, and electrostatic protection diodes D5 and D6 described above are replaced by electrostatic protection diodes D1 and D2.

The anode of the electrostatic protection diode D1 (equivalent to a first electrostatic protection element) is connected to the pad P2. The cathode of the electrostatic protection diode D1 is connected to the application terminal of the power supply voltage VDD. When a positive surge (>VDD) is applied to the pad P2, the electrostatic protection diode D1 connected as above achieves the function of releasing the positive surge to the application terminal of the power supply voltage VDD. The above feature is the same as the electrostatic protection diode D5 described above. Moreover, different from the electrostatic protection diodes D3 and D5 described above, a diode with a PN structure is used as the electrostatic protection diode D1 (with details described below).

The cathode of the electrostatic protection diode D2 (equivalent to a second electrostatic protection element) is connected to the pad P2. The anode of the electrostatic protection diode D2 is connected to the application terminal of the ground voltage GND. When a negative surge (<GND) is applied to the pad P2, the electrostatic protection diode D2 connected as above achieves the function of releasing the negative surge to the application terminal of the ground voltage GND. The above feature is the same as the electrostatic protection diode D6 described above. Moreover, different from the electrostatic protection diodes D4 and D6 described above, a diode with a PN structure is generally used as the electrostatic protection diode D2 (with details described below).

Thus, in the signal processing device 20 of this embodiment, since the electrostatic protection diodes D1 and D2 are set to have the same structure (for example, a PN structure), the same leakage current characteristics are fundamentally provided. Hence, the leakage current flowing into each of the electrostatic protection diodes D1 and D2 fundamentally has the same value, and so it is unlikely for the error current Ierr equal to the difference to flow. As a result, the input offset of the acceleration signal S10 can be reduced, hence enhancing the detection precision of acceleration.

Moreover, in the electrostatic protection diodes D1 and D2 with a PN structure, different from the MOS structure described above, the leakage current path passing through the MOSFET is not present. Thus, since the leakage current flowing into each of the electrostatic protection diodes D1 and D2 is already small and cancels out each other, the error current Ierr is almost equal to 0. Hence, the input offset of the acceleration signal S10 is almost 0.

Moreover, the bias voltage Vm for determining a bias point of the pad P2 may be set to a midpoint voltage (=(VDD−GND)/2) of the power supply voltage VDD and the ground voltage GND. According to the bias setting above, the voltage applied between the anode/cathode of each of the electrostatic protection diodes D1 and D2 is consistent. Thus, the leakage current flowing into each of the electrostatic protection diodes D1 and D2 is close to a same value, and so the error current Ierr equivalent to the difference (hence the input offset of the acceleration signal S10) can be reduced.

<Electrostatic Protection Diode>

Figure 10:
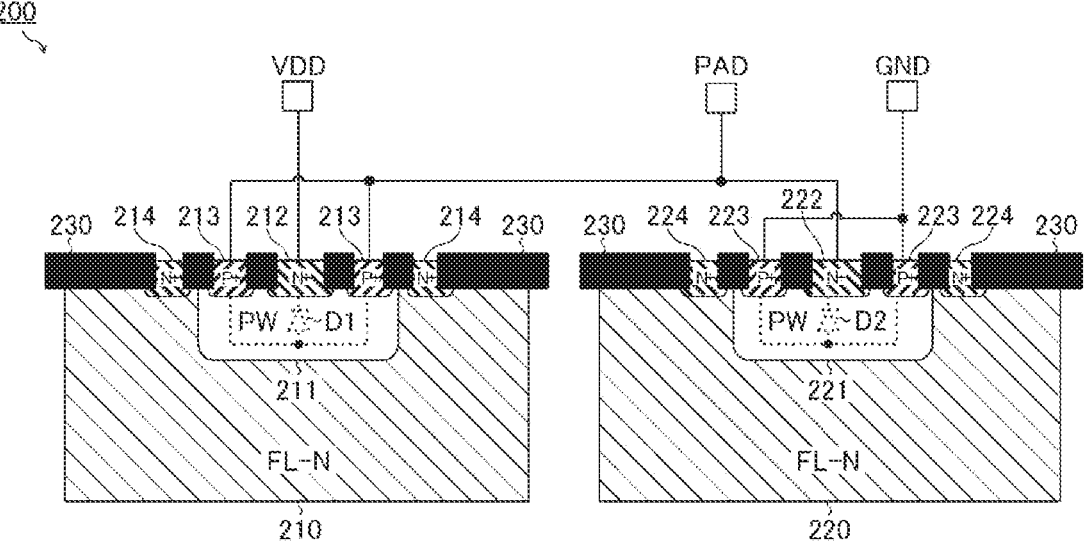
FIG. 10 is a diagram of vertical structures of electrostatic protection diodes.

FIG. 10 shows a diagram of vertical structures of the electrostatic protection diodes D1 and D2. A semiconductor device 200 (equivalent to the signal processing device 20 described above) forming each of the electrostatic protection diodes D1 and D2 has floating N-type semiconductor regions 210 and 220.

A P-type well 211 is formed near a surface of the floating N-type semiconductor region 210. In the P-type well 211, a high-concentration N-type semiconductor region 212, and a high-concentration P-type semiconductor region 213 surrounding the high-concentration N-type semiconductor region 212 are formed, respectively. At least a portion of the high-concentration P-type semiconductor region 213 is not covered by a protection layer 230 and is exposed from the surface, and is applied with a pad potential PAD (=acceleration signal S10 of the pad P2). At least a portion of the high-concentration N-type semiconductor region 212 is not covered by the protection layer 230 and is exposed from the surface, and is applied with the power supply voltage VDD.

Moreover, a high-concentration N-type semiconductor region 214 adjacent to and surrounding the P-type well 211 is formed near the surface of the floating N-type semiconductor region 210. At least a portion of the high-concentration N-type semiconductor region 214 is not covered by the protection layer 230 and is exposed from the surface, and is applied with a first floating potential FL1 (not shown).

A P-type well 221 is formed near the surface of the floating N-type semiconductor region 220. In the P-type well 221, a high-concentration N-type semiconductor region 222, and a high-concentration P-type semiconductor region 223 surrounding the high-concentration N-type semiconductor region 222 are formed, respectively. At least a portion of the high-concentration P-type semiconductor region 223 is not covered by the protection layer 230 and is exposed from the surface, and is applied with the ground voltage GND. At least a portion of the high-concentration N-type semiconductor region 222 is not covered by the protection layer 230 and is exposed from the surface, and is applied with the pad potential PAD.

Moreover, a high-concentration N-type semiconductor region 224 adjacent to and surrounding the P-type well 221 is formed near the surface of the floating N-type semiconductor region 220. At least a portion of the high-concentration N-type semiconductor region 224 is not covered by the protection layer 230 and is exposed from the surface, and is applied with a second floating potential FL2 (not shown).

Moreover, the electrostatic protection diode D1 is formed to have the P-type well 211 (equivalent to a first P-type well) as an anode, and to have the high-concentration N-type semiconductor region 212 (equivalent to a first N-type semiconductor region) formed in the P-type well 211 as a cathode.

Moreover, the electrostatic protection diode D2 is formed to have the P-type well 221 (equivalent to a second P-type well) as an anode, and to have the high-concentration N-type semiconductor region 222 (equivalent to a second N-type semiconductor region) formed in the P-type well 221 as a cathode.

Moreover, it is expected that a first junction area between the P-type well 211 and the high-concentration N-type semiconductor region 212 is designed to be equal to a second junction area between the P-type well 221 and the high-concentration N-type semiconductor region 222. According to the element design above, the leakage current flowing into each of the electrostatic protection diodes D1 and D2 is equal, and the parasitic capacitance accompanying each of the electrostatic protection diodes D1 and D2 is also equal. As a result, the input offset of the acceleration signal S10 can be reduced, hence enhancing the detection precision of acceleration.

<Improvement of Input Offset>

Figure 11:
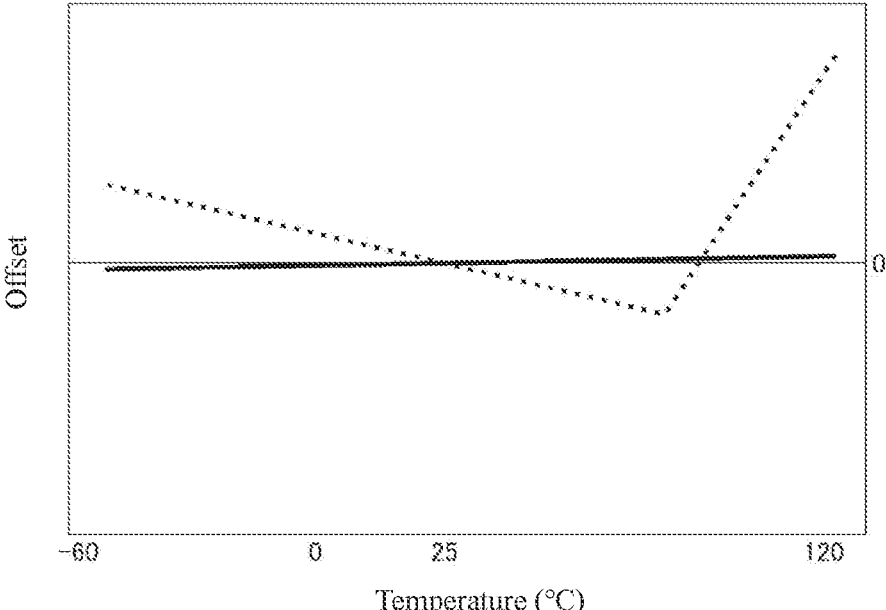
FIG. 11 is a diagram of temperature characteristics of an input offset.

FIG. 11 shows a diagram of temperature characteristics of an input offset in the signal processing device 20. The solid line represents temperature characteristics of the fourth embodiment (FIG. 9), and the dotted line represents temperature characteristics of the third embodiment (FIG. 8).

As shown by the dotted line in this drawing, in the acceleration sensor 1 of the third embodiment (FIG. 8), since the respective structures (hence the leakage current characteristics) of the electrostatic protection diodes D5 and D6 are significantly different, the input offset, in particular in a high temperature domain, increases.

In view of the above, as shown by the solid line in this drawing, for the acceleration sensor 1 of the fourth embodiment (FIG. 9), the respective structures (hence the leakage current characteristics) of the electrostatic protection diodes D1 and D2 are the same, and so the input offset from a low temperature domain to a high temperature domain is almost 0 and thus flatter. Therefore, such acceleration sensor is suitable for applications (for example, in-vehicle machines and industrial machines) that also have to accurately detect acceleration in high-temperature environments.

<Conclusion>

A summary of the various embodiments of the above description is provided below.

For example, an acceleration sensor disclosed in the present application is an acceleration sensor including a sensor device and a signal processing device sealed in a single package, wherein the sensor device is configured to generate an acceleration signal, and the signal processing device is configured to process the acceleration signal, and is configured (as a first configuration) as below; the signal processing device includes: a signal input terminal, configured to receive an external input of the acceleration signal; a first electrostatic protection element, configured to be connected between the signal input terminal and a first node to which a first voltage is applied; and a second electrostatic protection element, configured to be connected between the signal input terminal and a second node to which a second voltage is applied, wherein the first electrostatic protection element and the second electrostatic protection element have same structure and same leakage current characteristic.

The acceleration sensor of the first configuration may also be configured (as a second configuration) that, the acceleration signal is an analog signal.

The acceleration sensor of the first or second configuration may also be configured (as a third configuration) that, the first electrostatic protection element and the second electrostatic protection element are both electrostatic protection diodes with a PN structure.

The acceleration sensor of the third configuration may also be configured (as a fourth configuration) that, the first electrostatic protection element has a first P-type well as an anode and a first N-type semiconductor region formed in the first P-type well as a cathode, and the second electrostatic protection element has a second P-type well as an anode and a second N-type semiconductor region formed in the second P-type well as a cathode.

The acceleration sensor of the fourth configuration may also be configured (as a fifth configuration) that, a first junction area between the first P-type well and the first N-type semiconductor region is equal to a second junction area between the second P-type well and the second N-type semiconductor region.

The acceleration sensor of any one of the first to fifth configurations may also be configured (as a sixth configuration) that, the signal input terminal is biased to a midpoint voltage of the first voltage and the second voltage.

The acceleration sensor of any one of the first to sixth configurations may also be configured (as a seventh configuration) that, the signal processing device includes: an input amplifier, configured to amplify the acceleration signal to generate an amplified acceleration signal; an analog-to-digital converter (ADC), configured to convert the amplified acceleration signal to a digital signal; a processor, configured to generate a sensor output signal from the digital signal; and an interface, configured to externally output the sensor output signal.

The acceleration sensor of the seventh configuration may also be configured (as an eighth configuration) as, further comprising: a signal output terminal, configured to externally output the sensor output signal; a third electrostatic protection element, configured to be connected between the signal output terminal and the first node; and a fourth electrostatic protection element, configured to be connected between the signal output terminal and the second node.

The acceleration sensor of the seventh or eighth configuration may also be configured (as a ninth configuration) that, the signal processing device further includes: an offset correction unit, configured to reduce a temperature gradient of an offset of the acceleration signal; and an offset adjustment unit, configured to trim and adjust the offset.

The acceleration sensor of any one of the first to ninth configurations may also be configured (as a tenth configuration) that, the sensor device includes a fixed electrode and a variable electrode configured to change a position relative to the fixed electrode according to an acceleration applied to the sensor device, wherein a voltage corresponding to a change in distance between the fixed electrode and the variable electrode is output as the acceleration signal.

Other Variation Examples

Further, in addition to the embodiments, various modifications may be applied to the technical features disclosed by the present disclosure without departing from the scope of the technical inventive subject thereof. That is to say, it should be understood that all aspects of the embodiments are illustrative rather than restrictive, and it should be also understood that the technical scope of the present disclosure is defined by the appended claims and includes all modifications of equivalent meanings within the scope of the appended claims.

The invention claimed is:

1. An acceleration sensor, comprising:
a sensor device and a signal processing device sealed in a single package, wherein the sensor device is configured to generate an acceleration signal, and the signal processing device is configured to process the acceleration signal and includes:
a signal input terminal, configured to receive an external input of the acceleration signal;
a first electrostatic protection element, configured to be directly connected between the signal input terminal and a first node to which a first voltage is applied; and
a second electrostatic protection element, configured to be directly connected between the signal input terminal and a second node to which a second voltage is applied, wherein
the first electrostatic protection element and the second electrostatic protection element have same structure and same leakage current characteristic.

2. The acceleration sensor of claim 1, wherein the acceleration signal is an analog signal.

3. The acceleration sensor of claim 1, wherein the first electrostatic protection element and the second electrostatic protection element are both electrostatic protection diodes with a PN structure.

4. The acceleration sensor of claim 3, wherein
the first electrostatic protection element has a first P-type well as an anode and a first N-type semiconductor region formed in the first P-type well as a cathode, and
the second electrostatic protection element has a second P-type well as an anode and a second N-type semiconductor region formed in the second P-type well as a cathode.

5. The acceleration sensor of claim 4, wherein a first junction area between the first P-type well and the first N-type semiconductor region is equal to a second junction area between the second P-type well and the second N-type semiconductor region.

6. The acceleration sensor of claim 1, wherein the signal input terminal is biased to a midpoint voltage of the first voltage and the second voltage.

7. The acceleration sensor of claim 1, wherein the signal processing device includes:
an input amplifier, configured to amplify the acceleration signal to generate an amplified acceleration signal;
an A/D converter, configured to convert the amplified acceleration signal to a digital signal;
a processor, configured to generate a sensor output signal from the digital signal; and an interface, configured to externally output the sensor output signal.

8. The acceleration sensor of claim 7, further comprising:

a signal output terminal, configured to externally output the sensor output signal;

a third electrostatic protection element, configured to be connected between the signal output terminal and the first node; and a fourth electrostatic protection element, configured to be connected between the signal output terminal and the second node.

9. The acceleration sensor of claim 7, wherein the signal processing device includes:

an offset correction unit, configured to reduce a temperature gradient of an offset of the acceleration signal; and an offset adjustment unit, configured to trim and adjust the offset.

10. The acceleration sensor of claim 1, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

11. The acceleration sensor of claim 2, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

12. The acceleration sensor of claim 3, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

13. The acceleration sensor of claim 4, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

14. The acceleration sensor of claim 5, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

15. The acceleration sensor of claim 6, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

16. The acceleration sensor of claim 7, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

17. The acceleration sensor of claim 8, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

18. The acceleration sensor of claim 9, wherein the sensor device includes:

a fixed electrode; and a variable electrode, configured to change position relative to the fixed electrode according to an acceleration applied to the sensor device, wherein a voltage corresponding to a change in distance between the fixed electrode and the variable electrode is output as the acceleration signal.

* * * * *